(12) United States Patent
Nishiyama

(10) Patent No.: US 6,207,486 B1
(45) Date of Patent: Mar. 27, 2001

(54) SEMICONDUCTOR DEVICE AND A METHOD OF MANUFACTURING THE SAME

(75) Inventor: Akira Nishiyama, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/151,401

(22) Filed: Sep. 11, 1998

(30) Foreign Application Priority Data

Sep. 12, 1997 (JP) ................................... 09-248160

(51) Int. Cl.⁷ ............................................... H01L 21/8238
(52) U.S. Cl. ............................................ 438/216; 438/629
(58) Field of Search ........................................ 438/629, 631, 438/637, 648, 714, 715, 724; 257/382, 640

(56) References Cited

U.S. PATENT DOCUMENTS

| 5,103,272 | 4/1992 | Nishiyama | 357/23.4 |
| 5,183,780 | 2/1993 | Noguchi et al. | 437/173 |
| 5,831,899 | * 11/1998 | Wang et al. | 365/156 |

FOREIGN PATENT DOCUMENTS

| 8-306772 | 11/1996 | (JP) . |
| 9-8135 | 1/1997 | (JP) . |

* cited by examiner

Primary Examiner—David Nelms
Assistant Examiner—Quoc Hoang
(74) Attorney, Agent, or Firm—Foley & Lardner

(57) ABSTRACT

An object of the present invention is to provide a semiconductor device manufacturing method capable of facilitating achievement of reliable electrical connections between an electrode and a wiring layer in different layers or between wiring layers therein.

In accordance with one aspect of the present invention, a semiconductor device manufacturing method includes the steps of forming an element isolation region 51 on one main surface of a semiconductor substrate 50, forming a gate electrode 53, forming source and drain electrodes 56, forming an insulator nitride film 57 on the main surface of the semiconductor substrate 50, forming an interlayer insulator 58 with more than one contact hole H, converting part of the insulator nitride film 57 at the bottom of the contact hole H into a conductive nitride film 61 that is higher in bonding energy than the insulative nitride, and forming wiring layer 62 connected to the source/drain electrodes 56 through the conductive nitride film 61.

20 Claims, 6 Drawing Sheets

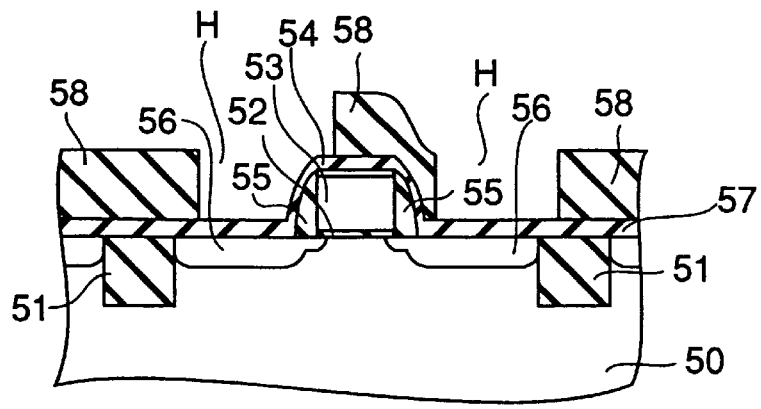
Fig,4a
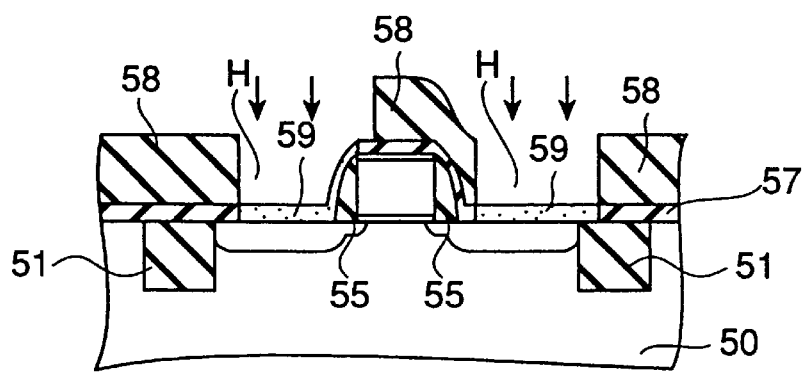
Fig,4b
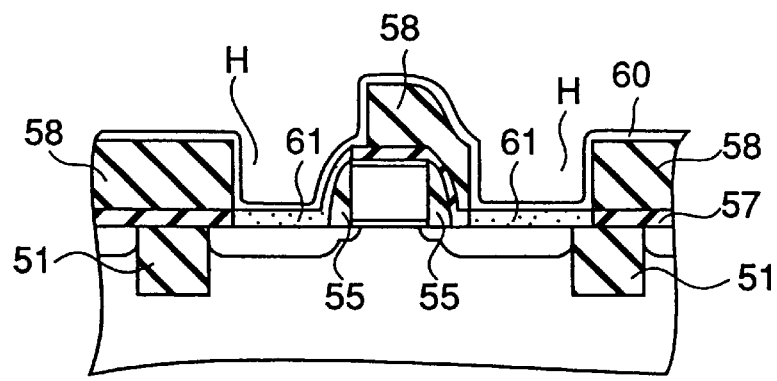
Fig,4c
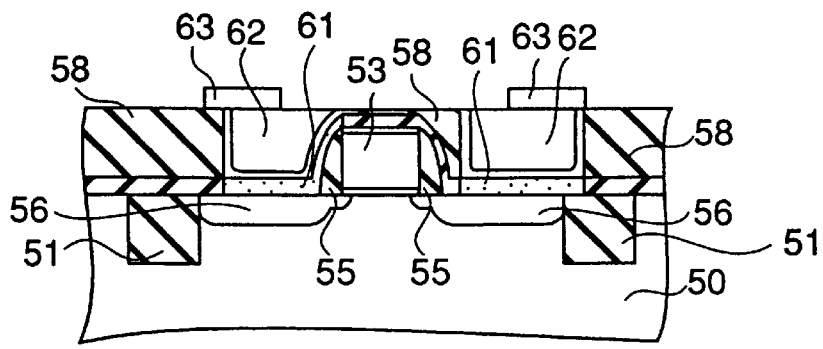
Fig,4d

SEMICONDUCTOR DEVICE AND A METHOD OF MANUFACTURING THE SAME

FIELD OF THE INVENTION

The present invention relates generally to a method for manufacturing semiconductor devices and forming a wiring layer. More particularly, but not exclusively, the invention relates to a semiconductor device manufacturing method including the step of forming a semiconductor device electrode along with more than one wiring layer connected thereto as well as a method of forming wiring layer.

BACKGROUND OF THE INVENTION

In the recent years it is becoming more important for semiconductor integrated circuit (IC) devices to meet endless demands for device miniaturization with higher integration density, which in turn wiring layers to drastic advances in microfabrication technology of metal oxide semiconductor (MOS) transistors for use with such ICs. Typically, one prior known MOS transistor includes a gate electrode formed on the main surface of a semiconductor substrate with a gate insulator layer laid therebetween, and a pair of spaced-apart source and drain electrodes formed in the main surface of the semiconductor substrate in a manner such that these are self-aligned with the gate electrode. The gate electrode and source/drain electrodes are such that each is connected to its overlying chip wiring layer through a conductive through hole in an interlayer dielectric film sandwiched between the electrode and the wiring layer for electrical connection to active and/or passive IC components operatively associated therewith. Such "internal" chip wiring layer are typically achieved by first forming in an overlying interlayer insulator a contact hole coupled to an associative wiring layer or electrode in an underlying layer, then forming a conductive connector material buried in the contact hole, and further forming an upper wiring layer connected to the conductor. The lower wiring layer and electrode are photolithographically fabricated using photo-etching process into a predefined pattern. Preferably, the pattern of contact holes connected thereto is formed by photo-etching alignment process so that the pattern is accurately aligned in position with those wiring layers in a low-level layer. It is also preferable that these contact holes thus formed are position-aligned with and appropriately connected to their overlying wiring layers in the upper level layer, through a similar position alignment procedure.

Unfortunately, semiconductor technologies are faced with difficulties in achieving precise position alignment between different patterns at different levels over a chip substrate, which would result in occurrence of pattern misalignment. This wiring layers to the risk of short-circuiting between unintentional short of wiring layers and electrodes. To avoid this, an extra area must be consumed as an alignment margin on the substrate surface. One example is that while the use of photo-lithography's minimal fabricatable size permits microfabrication of a rectangular or square contact hole to the extent that it measures 0.1 $\mu$m in side length, addition of such "extra" alignment margin thereto results in an increase in "net" side length of underlying electrodes and wiring layers up to 0.5 $\mu$m or wider.

Hence, providing the alignment margin per pattern serves as a serious bar to successful achievement of microfabrication or "down-sizing" of ICs as required.

Another problem encountered with the prior art approach is that the underlying wiring layers and electrodes of an increased pattern width due to addition of the alignment margin come with a parasitic resistance and parasitic capacitance, which can deteriorate high-speed characteristics of IC components.

One proposed approach for avoiding the problems associated with the prior art is to employ a self-aligned contact (SAC) structure, wherein contact holes are formed in self-alignment with electrodes and wiring layers in a lower layer.

Some prior art MOS transistor structures are shown in FIGS. 1a to 1c, wherein each transistor has contact holes H as formed by the SAC technique and connected to source/drain electrodes 15.

A respective one of the prior art MOS transistor shown in FIGS. 1a–1c is within one of element regions on the main surface of a semiconductor substrate 10, which regions are electrically insulated from each other by an element isolation region 11 as formed on the substrate surface. The MOS transistor consists essentially of a gate oxide film 12, a gate electrode 13, gate-sidewall dielectric films 14 on the opposite sidewalls of gate electrode 13, and source/drain electrodes 15 as formed by ion implantation with the gate electrode 13 and gate-sidewall dielectric films 14 being as a mask. An interlayer insulator 16 is formed on the surface of the MOS transistor, which film may be a fluorine doped low-dielectric-constant silicon oxide film or the like. Contact holes H are defined in the interlayer insulator 16, wherein contact wiring layers (not shown in the Fig.) are formed in these contact holes H for electrical connection of the source/drain electrodes 15 and gate electrode 13 to their associated wiring layers on the interlayer insulator 16.

FIG. 1a depicts the cross-sectional structure of one exemplary prior art MOS transistor, wherein misalignment results in one of the contact holes H being laterally offset exposing the sidewall of one gate-sidewall dielectric film 14 as shown. By forming the gate-sidewall dielectric film 14 using a silicon nitride film or the like which has a specified etching selection ratio with respect to silicon oxide of the interlayer insulator 16, it is possible to leave the gate-sidewall dielectric film 14, which in turn makes it possible to eliminate unwanted conduction with the semiconductor substrate 10 in those regions other than the intended regions. However, sufficient prevention of such conduction requires formation of the sidewall dielectric film 14 to a thickness greater than a standard thickness, which would result in contradiction with the device miniaturization or microfabrication of MOS tansistors required.

See FIG. 1b. This illustrates in cross-section another prior art MOS transistor structure, wherein misalignment causes one contact hole H to be offset rightward extending so that it rides on a local oxidation of silicon (LOCOS) element isolation region 11. Such offset of contact hole H toward the element isolation region 11 makes it impossible to prevent the element isolation region made of a silicon oxide film or the like from being partly etched away at its periphery D. This would result in an increase in current leakage between the semiconductor substrate 10 and a contact wiring layer being formed within the offset contact hole H. To avoid this problem, a scheme has been proposed for additionally doping an impurity of the same conductivity type as that of source/drain electrodes 15 by ion implantation into a selected region beneath the etching-removed element isolation region's periphery D to thereby extend the source/drain electrodes 15. However, this approach suffers from a problem that a leak current can flow between the source/drain and the neighboring semiconductor device components if such extension of the source/drain electrodes 15 renders narrower the element isolation region 11 to the extent that the resulting width is approximately 0.5 $\mu$m or less.

See FIG. 1c, which shows a still another prior art MOS transistor employing a shallow trench isolation (STI) structure for use as the element isolation film as in the previous LOCOS element isolation region shown in FIGS. 1a–1b, wherein misalignment results in one contact hole H being offset toward the side of such STI region 11a. The STI region 11a can be deeply etched away at its periphery to have a "groove" deeper than the source/drain electrodes 15. If this is the case, the dielectricity is lowered between the semiconductor substrate 10 and source/drain electrodes 15 causing a problem such as noise generation or the like.

A yet another prior art contact hole formation method is shown in FIGS. 2a–2b, which depict some major steps in the fabrication of a MOS transistor that employs a silicon nitride film beneath the interlayer insulator to act as an etching stopper. The cross-sectional structures shown assumes that the pattern of contact hole H is offset toward the STI region 11a.

This method is such hat prior to formation of the prescribed interlayer insulator 16, an etching stopper film 14b of silicon nitride is formed by chemical vapor deposition (CVD) techniques on the main surface of the semiconductor substrate 10, which has the insulated gate electrode 13 and gate sidewall dielectric films 14a plus source/drain electrodes 15 formed as shown in FIG. 2a.

Then, as shown in FIG. 2a, an interlayer insulator 16 made of silicon oxide is formed; thereafter, contact holes H are defined therein for electrical connection to the source/drain electrodes 15. During this process, the progress of etching treatment is temporarily terminated on the surface of silicon nitride film 14b by utilizing the etching selection ratio (30:1) of silicon oxide of the interlayer insulator 16 versus silicon nitride. Subsequently, by utilizing here the inverse etching or "backetching" selection ratio (1:10) between the silicon nitride and silicon oxide, let the etching progress step at the surface of the silicon oxide film 14a as shown in FIG. 2a. Then, as shown in FIG. 2b, remove by etching the silicon oxide film 14a causing the semiconductor substrate 10 to be exposed on its main surface. However, in this case also, the etching treatment of silicon oxide film 14a can partly remove the STI region 11a made of the same material at the periphery thereof. As a result of such unwanted etching removal, current leakage can occur between the semiconductor substrate 10 and source/drain electrodes 15. In addition, production costs increase due to the need for additional process steps including deposition and etching of the interlayer insulator 16 and silicon nitride film 14b as well as silicon oxide film 14a.

Although the foregoing explanations are drawn to the fabrication of contact wiring layers in MOS transistors, similar problems will possibly arise with regard to formation of "via" contact holes for use in connecting a wiring layer pattern at the n-th level layer to a wiring layer at the (n+1)-th layer over a chip substrate. This will be explained in more detail with reference to FIG. 3 under the assumption that a via contact is formed between certain wiring layer patterns at the second and third level layers.

Prior to formation of such via contact, prepare a semiconductor substrate 10 with semiconductor device components (not shown in the Fig.) formed thereon; then, form a lamination of films on the main surface of the substrate, including a first or "lower" interlayer insulator 16, a wiring layer 17 in a first-level layer (first wiring layer) on the film 16, a second or interlayer insulator 26 covering the wiring layer 17, second-layer wiring layers 27a, 27b on the interlayer dielectric film 26, and a third or "upper" interlayer insulator 36 overlying these wiring layers 27a, 27b. A contact hole V for "via" contact is a through-hole for use in connecting the second wiring layer 27a and a third wiring layer being formed on the upper dielectric film 36. In this respect, it is not preferable that the via hole is used for connection with those wiring layers other than the second wiring layer 27a.

One serious problem associated with the prior art is that upon occurrence of positional misalignment of the kind stated supra, even the first wiring layer 17 can be exposed through the contact hole V resulting in unwanted shortcircuiting with a contact wiring layer as formed inside the contact hole V. This takes place even where the contact hole V does not reach the first wiring layer 17 per se. More specifically, it is difficult in such case also to completely attain the intended isolation by use of presently available interlayer insulators that tend to decrease in thickness with an increase in integration density so that the risk of leak current generation remains higher. Another problem is that the interlayer insulator with a reduced thickness due to formation of the contact hole V has an increased parasitic capacitance, which in turn behaves badly to increase crosstalk between the wiring layer in contact hole V and the first wiring layer or wiring layers.

SUMMARY OF THE INVENTION

As described above, the prior art MOS transistor manufacturing method employing the SAC suffers from an inability to contribute to microfabrication technologies, and a decrease in dielectricity between the source/drain electrodes and the semiconductor substrate as electrically separated by an element isolation region laid therebetween as well as dielectricity relative to other semiconductor device components, and moreover an increase in parasitic resistance and parasitic capacitance. A further problem faced with the prior art lies in the risk of shortcircuiting and crosstalk between a wiring layer and its neighboring unintentional wiring layer or electrode when connecting between them as formed in different ones of the layers laminated It is therefore an object of the present invention to avoid the problems encountered with the prior art. Another object of the invention is to provide a method for manufacturing semiconductor devices and a wiring layer formation method free from the problems and also capable of achieving highly reliable electrical connections between electrodes and wiring layers or between wiring layers in different layers laminated at different levels over a substrate.

In accordance with a first aspect, the present invention provides a method of manufacturing a semiconductor device comprising steps of: forming a gate electrode adjacent to a main surface of a semiconductor substrate; forming a source and a drain electrode in the main surface of the semiconductor substrate, the gate electrode disposed between the source electrode and the drain electrode; forming a first nitride layer over one of the gate electrode, the source electrode, and the drain electrode, the first nitride layer comprising insulator nitride, the insulator nitride being compound of nitrogen and a material; forming an interlayer insulator over the first nitride layer, and the interlayer insulator has a through-hole above one of the gate electrode, the source electrode, and the drain electrode; forming a second nitride layer comprising a conductive nitride, the second nitride layer being at a bottom of the through-hole; and forming a wiring layer in the through-hole, the wiring layer coupled to one of the gate electrode, the source electrode, and the drain electrode, through the second nitride layer.

In accordance with a second aspect, the invention provides a method of manufacturing a semiconductor device comprising a steps of forming a first wiring layer or an electrode adjacent to a first insulator layer, forming a first nitride layer comprising a insulator nitride over the first wiring layer or the electrode, the insulator nitride is compound of nitrogen and a material; forming an interlayer insulator layer over the first nitride layer, and the interlayer insulator layer has a through-hole above the first wiring layer or the electrode; forming a second nitride layer comprising conductive nitride, the second nitride layer being at a bottom of the through-hole; and forming a second wiring layer in the through-hole, the second wiring layer being coupled to the first wiring layer or the electrode through the second nitride layer.

In accordance with a third aspect, the invention provides a semiconductor device comprising, a substrate having a main surface, a gate electrode formed adjacent to the main surface; a source and a drain electrode formed in the main surface; a first nitride layer comprising insulator nitride, the first nitride layer being formed over one of the gate electrode, the source electrode, and the drain electrode, the insulator nitride being a compound of nitrogen and a material; an interlayer insulator formed over the fist nitride layer, the interlayer insulator having a through-hole over one of the gate electrode, the source electrode, and the drain electrode; a second nitride layer formed at a bottom of the through-hole, the second nitride layer comprising a conductive nitride, and a wiring layer formed in the through-hole, the wiring layer being coupled to one of the gate electrode, the source electrode, and the drain electrode through the second nitride layer.

Additionally, the step of forming the conductive nitride layer from the insulator nitride layer may be converting the insulator nitride layer to the conductive nitride layer of higher bonding energy than the insulative nitride and may include the steps of providing a mixture layer of nitrogen and another chosen material(s) which constitute the insulative nitride, and forming a conductive film containing a chosen reactive conductive material in the surface of this mixture layer to thereby permit the reactive conductive material to react with nitride of the insulative nitride.

Furthermore, it will be recommendable in view of reduction of production costs that the step of forming the mixture layer containing therein nitrogen and other elements that constitute the insulative nitride is performed by irradiation of ions on the insulative nitride.

It may be noted that the nitride constituting the insulative nitride film may be comprised of nitrogen, N, and a material, A, as coupled or bonded thereto. Where a mixture may be in the state that the bonding of this insulative nitride, AN, may be cut or disconnected, when a reactive material B having a large bonding energy with N comes into contact therewith, the resultant film may be changed from the state in which the material A and reactive material B and also nitrogen N may be present independently, i.e. mixed without bonding together, to a state in which conductive nitride BN with the conductive material B and nitrogen N bonded together and the material A may be mixed therein. For example, suppose that the material A is silicon (Si) whereas the reactive material B is titanium (Ti). In this case, N may attempt to bond or combine with Ti due to the fact that the bonding energy of SiN is 44.3 kcal/Natom whereas TiN is 80 kcal/Natom in bonding energy, whereby TiN may be produced as the conductive nitride film BN.

On the other hand, while such conductive material BN may be formed in an element isolation region placed next to an electrode and in the AN surface on an interlayer insulator adjacent to a wiring layer, production of dielectric films may progress at an interface between the AN and a dielectric film constituting the element isolation region or interlayer insulator, which films may include a dielectric film containing therein A and a dielectric film containing B. The reason of this is as follows. Supposing in the above exemplary case that the dielectric film constituting the element isolation region or interlayer insulator may be a silicon oxide film, silicon oxide ($SiO_2$) and titanium oxide ($TiO_2$) may be greater in bonding energy than any one of SiN and TiN, where SiN may be the insulative nitride film AN, and TiN is conductive nitride film BN. Accordingly, fabrication of the conductive nitride film BN may be terminated at the SiN film to thereby ensure that the element isolation region and interlayer insulator may be hardly removed unnecessarily during etching, which in turn enables maintenance of excellent dielectricity.

It is also noted that the reactive material in the present invention may be a chosen metal that has in principle the bonding energy with N or Si greater than the bonding energy of Si—N. The metal may typically be Al, Ni, Co, Hf, Cu, Ti, Ta, Zr, Nb, V, or any equivalents thereto. The metal may also be a ternary conductive compound-producible metal such as W or Ta, which offers producibility of ternary conductive compound such as WSiN, or TaSiN upon bonding or combination with SiN.

Further, the insulative nitride film in the instant invention may be a nitride material which is comprised of a chemical compound of nitrogen and another chosen element or elements and which is capable of providing electrical insulation between wiring layers to be insulated. As far as this characteristic is not deteriorated, other elements and/or chemical compounds may be mixed thereinto. Similarly, the conductive nitride film consists essentially of a compound of nitrogen and other elements, such as a chosen nitride material with electrical connectivity between the intended wiring layers or between an electrode and a wiring layer associated therewith. Other elements and compounds may be mixed thereinto unless this characteristic is deteriorated.

With the features of the invention, it may be possible to form a wiring layer as selectively connected only to the target region with enhanced reliability even upon occurrence of misalignment between an electrode and a wiring layer different in pattern from each other or between wiring layers of different patterns. This in turn makes it possible to reduce the amount of misalignment "absorbing" margin while at the same time permitting the element isolation region to offer the intended dielectricity between the source/drain electrodes and a semiconductor substrate and also with other semiconductor device components. Another advantage of the invention lies in an ability to suppress or minimize an increase in parasitic resistivity and parasitic capacitance. A further advantage is that any unintentional shortcircuit with "wrong" wiring layers may be minimized while eliminating, or at least greatly suppressing, crosstalk therebetween when connecting between an electrode and a wiring layer in different layers or between wiring layers at different levels over the substrate surface.

According to the semiconductor device manufacturing method of the present invention, it is possible to facilitate reliable electrical connection between electrodes and wiring layers residing in different layers. In addition, the wiring layer formation method of the invention makes it possible to permit easy and simplified formation of electrical connections between wiring layers with enhanced reliability.

According to these invention, top surface of the first nitride layer and the second nitride layer may be substantially plane, besides the first nitride layer and the second nitride layer may be disposed on a same plane.

BRIEF DESCRIPTION OF THE DRAWINGS

A more complete appreciation of the invention and many of the attendant advantages thereof is readily obtained as the same becomes better understood by reference to the following detailed description when considered in connection with accompanying drawings, wherein

FIGS. 4a–4d illustrate in cross-section some of the major steps in the manufacture of a MOS transistor in accordance with a first embodiment of the present invention, for explanation of a method of forming contact wiring layers as connected to associative electrodes of the MOS transistor.

DESCRIPTION OF THE PREFERRED EMBODIMENTS

Figure 1A:
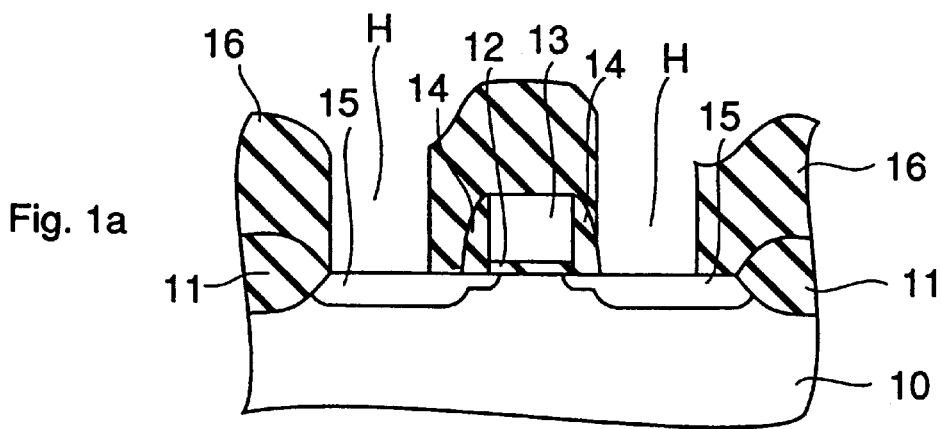
FIGS. 1a to 1c illustrates, in cross-section, some of the major steps in the manufacture of one typical prior known semiconductor device.
Figure 1B:
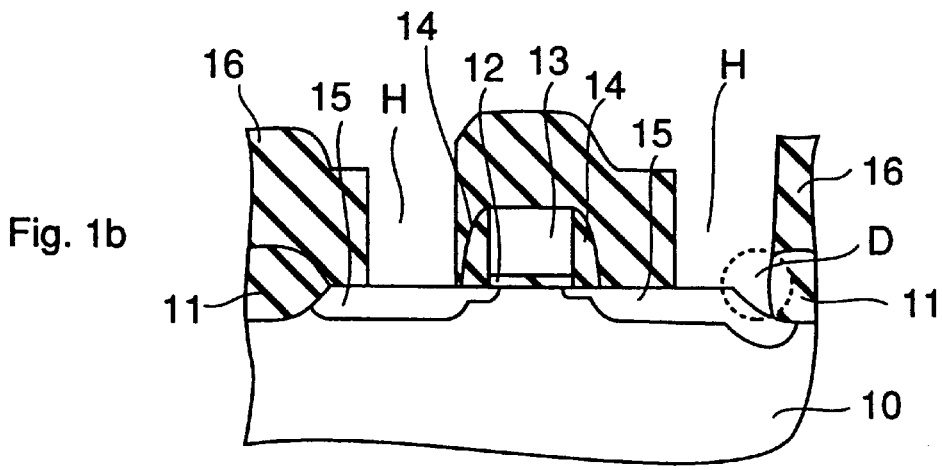
Figure 1C:
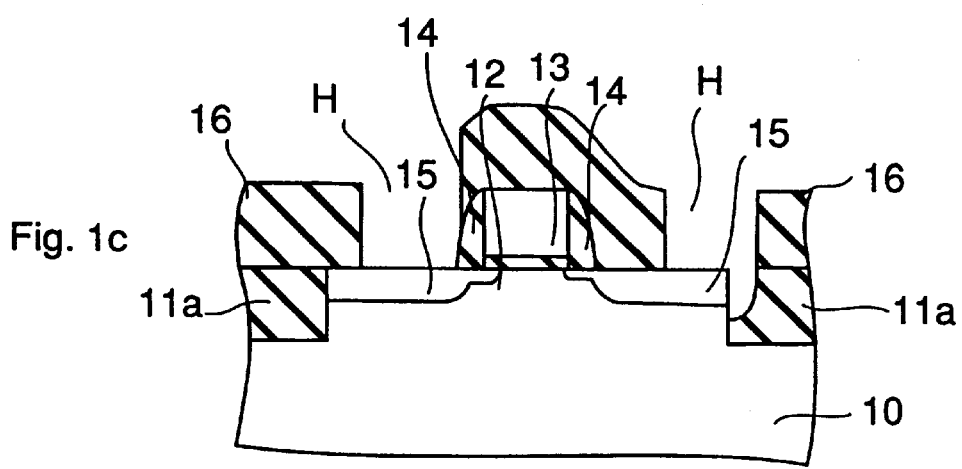
Figure 2A:
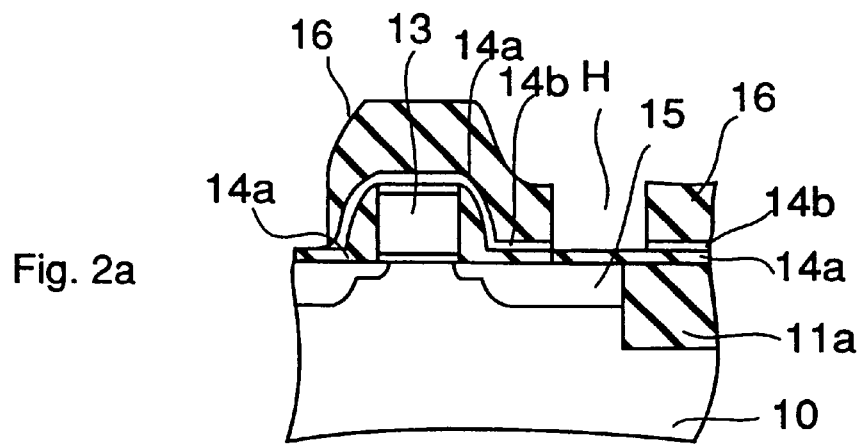
FIGS. 2a–2b illustrates in cross-section some of the major steps in the manufacture of the prior art semiconductor device.
Figure 2B:
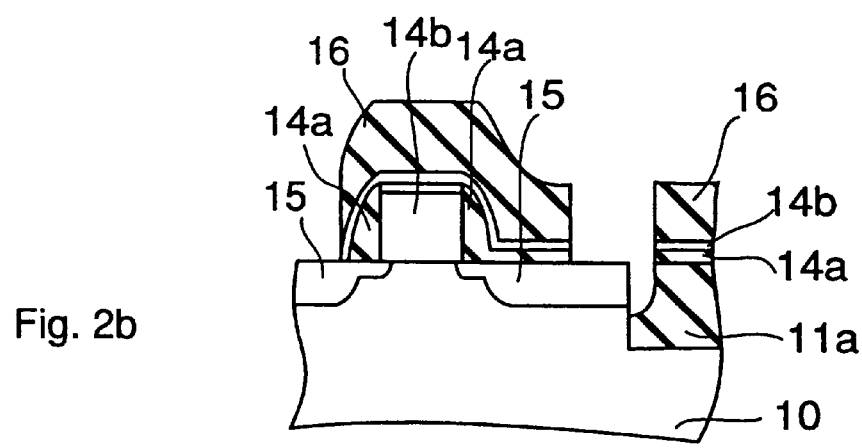
Figure 3:
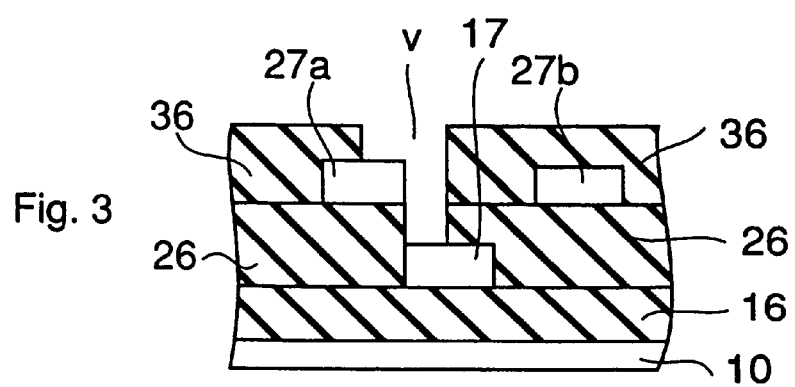
FIG. 3 is a sectional view of one prior art device.

Some preferred embodiments of the present invention will be explained with reference to the accompanying drawings below.

A first embodiment is directed to a method of forming contact wiring layers connected to the source/drain electrodes of a MOS transistor, along with a first-layer wiring layer.

FIGS. 4a to 4d illustrate, in cross-section, some of the major steps in the manufacture of the MOS transistor in accordance with the first embodiment.

First, as shown in FIG. 4a, shallow grooves or "trenches" are formed in an element isolation formation region on one main surface of a semiconductor substrate 50, such as a silicon (Si) substrate; then, a dielectric material such as silicon oxide is buried within each trench thus forming an STI region 51 therein. Thereafter, a silicon oxide film is formed by thermal oxidation on the main surface of the semiconductor substrate 50 to a predetermined thickness of approximately 4 nanometers (nm). Then, form sequentially on this silicon oxide film a polycrystalline silicon or "polysilicon" film and a silicon oxide film using low-pressure chemical vapor deposition (LPCVD) techniques, wherein the former is formed as a gate electrode 53 to a thickness of about 200 nm whereas the latter is to a thickness of 10 nm, or more or less. The resultant lamination of these films is then patterned by anisotropic etching techniques, such as photo-etching process and reactive ion etching (RE) methods, to have a pattern corresponding to the planar shape of the gate electrode. In the case an lightly-doped drain (LDD) region constituting part of source and drain electrodes is to be formed near the gate electrode 53, the main surface of semiconductor substrate 50 is further doped with a chosen impurity by ion implantation with a gate insulator layer 52 and the gate electrode 53 plus a silicon oxide film 54 being as a mask at a low dose and low acceleration energy. Thereafter, a silicon oxide film is formed by CVD techniques on the main surface of semiconductor substrate 50, which film is then backetched by anisotropic etching to thereby form the gate insulator layer 52, gate electrode 53, and a gate sidewall dielectric film 55 on each sidewall of silicon oxide film 54. Thereafter, deep impurity regions are formed by ion implantation in the surface of substrate 50 with the gate insulator layer 54 and gate electrode 53 plus silicon oxide film 54 as well as gate side dielectric film 55 being as a mask therefor. The regions formed will act as the source and drain electrodes. An impurity as used herein may be As, P or the like for N-channel MOS (NMOS) transistors and may alternatively be $BF_2$ or equivalents for PMOS transistors. In the case of As for example, ion implantation is performed with an acceleration energy of 10 kiloelectronvolts (KeV) at a dose amount of $1 \times 10^{15}$ atoms per square centimeter ($cm^{-2}$); if $BF_2$ is used then ion implantation is done with acceleration energy of 8 KeV at a dose of $1 \times 10^{15}$ $cm^{-2}$. The impurity thus doped in this way is activated by effectuation of thermal processing in an Ar environment at 900° C. for 30 seconds, by way of example, whereby spaced-apart source and drain electrodes 56 are formed as shown in FIG. 4a. Subsequently, as shown in FIG. 4a, a silicon nitride film 57, typically 50 nm thick, is formed by either sputtering or CVD techniques in the main surface of Si substrate 50. Next, a dielectric film of low dielectric constant, such as for example a fluorine-doped silicon oxide film, is deposited on the silicon oxide film 57 to a thickness of for example 400 nm or more or less as shown in FIG. 4a. This film will later function as an interlayer insulator 58. Therefor, contact holes H are formed by photolithography process or anisotropic etching techniques as shown in FIG. 4a, which contact holes are used for electrical connection to the source and drain electrode 56. Preferably, the etching is done under the condition that allows the intended selection ratio of the fluorine doped silicon oxide film with respect to the silicon nitride film 57—for example, using a $C_4F_8$/Co gas at an etching selection ratio of 30:1.

Subsequently, as shown in FIG. 4b, the main surface of silicon substrate 50 is doped by ion implantation with an impurity at a dose of $1 \times 10^{15}$ $cm^{-2}$ and acceleration energy of 10 KeV, for example, in order to cut off the Si—N linkage or bonding that resides in the silicon nitride film 57 as exposed at the bottom of each contact hole H. This results in that the interlayer insulator 58 serves as a mask causing only exposed part of the silicon nitride film 57 at the bottom of each contact hole H to become a mixture layer 59 comprised of Si and N. A gas used during such ion implantation should not exclusively be limited to Ar and may alternatively be Si, $N_2$, Xe or the like, for example. Optionally, a metal or the like to be reacted with nitrogen may be ion-irradiated onto the main surface of substrate 50 after cutoff of Si—N bonds. If the silicon nitride film 57 is as thin as 15 nm or less, then any separate ion implantation process for cutting off Si—N bonds will no longer be required because such Si—N bonds are cut off due to the sputtering effect during etching for formation of the contact holes H.

Next, as shown in FIG. 4c, a Ti film 60 that is a reactive conductive film unique to the invention is formed by sputtering or CVD techniques on the main surface of the silicon substrate 50 to a thickness of approximately 20 nm. Then, the Ti film 60 is subject to thermal processing at a temperature of 400° C. or higher thereby converting the Si/N mixture layer 59 into a TiN film 61 that contains therein Si atoms. Preferably, this thermal processing is done in a nitride atmosphere at 600° C. for 30 minutes, by way of example. When this is done, a layer containing much amount of silicon oxide ($SiO_2$) and titanium oxide ($TiO_2$) is formed at selected parts of the surface of the interlayer insulator 58—for example, on sidewall surfaces of the contact holes H.

Subsequently, a tungsten film is formed by CVD techniques on the main surface of silicon substrate 50 to a predetermined thickness, for example, 1 $\mu$m or more or less. Then, the surface of substrate 50 is polished for planarization by chemical/mechanical polishing (CMP) techniques to thereby provide plug wiring layers 62 coupled to the source/drain electrodes. Note here that since certain part of the Ti film 60 which resides on the surface of the interlayer insulator 58 will be removed away due to effectuation of the polishing, the device characteristics remain unaffected; on the other hand, the Ti film 60 on the sidewall surfaces of contact holes H acts as a conductive layer constituting part of the intended contact wiring layer. Thereafter, a metal film made of Al or the like, typically 400 nm thick, is formed on the main surface of substrate 50 and is then etched by RIE techniques using a gas containing $CCl_4$ to have a predefined pattern, thus forming a patterned first-layer wiring layer 63 as shown in FIG. 4d to thereby complete the procedure of the MOS transistor manufacturing method in accordance with the first embodiment of the invention.

It should be noted that the first embodiment may be arranged to employ a method of forming a chemical compound layer comprised of a metal and semiconductor disposed on the source/drain electrodes 56 and gate electrode 53 in a self-alignment manner. For example, in cases where the semiconductor substrate 50 for formation of the source/drain electrodes is a silicon substrate whereas the gate electrode is made of silicon, a self-aligned metal silicide film of low resistivity is formed on the electrode surfaces. In this case the metal silicide film and the TiN film containing Si stated supra are laminated on the substrate of each electrode in this order looked at from the substrate.

Figure 5:
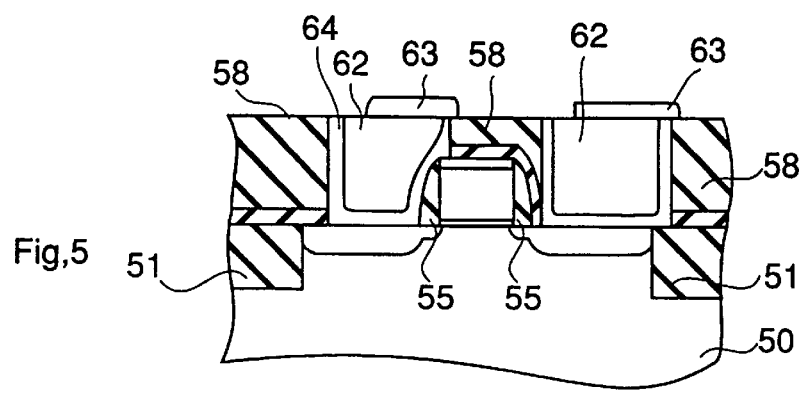
FIG. 5 depicts in cross-section a MOS transistor in accordance with an applied example of the first embodiment, for explanation of a method of forming contact wiring layers as connected to associative electrodes of the MOS transistor.

One applied example of the first embodiment will next be explained with reference to FIG. 5.

In this example, after formation of the contact holes H shown in FIG. 4b, only those portions of the silicon nitride film 57 which reside at the bottoms of contact holes H are removed away with the interlayer insulator 58 being as a mask therefor, using a chosen gas of the kind which achieves the intended etching selection ratio with respect to both the semiconductor material constituting the substrate 50, such as for example Si or the like, and the silicon oxide film making up the interlayer insulator 58—the gas typically contains therein a mixture of $CHF_3$ and $CF_4$. Then, form on the main surface of the substrate 50 a reaction prevention film 64, such as TiN, which may act to eliminate reaction between tungsten (W) constituting the contact wiring layer and the semiconductor material. Thereafter, as in the first embodiment discussed supra, the intended wiring layer wire configuration including the contact wiring layers 62 and first wiring layer 63 is formed.

The reaction prevention film 64 may be one of those films capable of eliminating reaction between the material constituting the semiconductor substrate and the material constituting the contact wiring layers 62 while allowing any preferable materials to be chosen in combination.

In this example the ion implantation for cutting off residual Si—N bonds in the silicon nitride film 57 is carried out after formation of the contact holes H, which in turn makes it possible to further improve the etching selection ratio with respect to the silicon oxide film used.

It is noted that while the first embodiment and its application example described are directed to the method of connecting the MOS transistor's source/drain electrodes to the contact holes associated therewith, the principles of the present invention are also applicable to a method for connection of the gate electrode and its associated contact wiring layer. Note however in this case that removal should be required of the silicon oxide film 54 on the conductive film such as the polysilicon film constituting the gate electrode. Further, the invention should not be limited to MOS transistors only, and may also be applicable to MESFETs using compound semiconductor substrates, especially for formation of contact wiring layers as connected to the gate electrode and soure/drain electrodes thereof. Similarly, the invention is adaptable for use in the manufacture of bipolar transistors as the method of forming respective contact wiring layers coupled to the base electrode and base extension electrode plus emitter electrode as well as collector electrodes. Furthermore, the methodology of the invention is applicable to interconnection of capacitor electrodes with source/drain electrodes in stacked DRAMs or SRAMs with capacitors overlying transistor regions.

(Second Embodiment)

A semiconductor device manufacturing method in accordance with a second embodiment of the invention will next be explained in conjunction with FIGS. 6a to 6c.

Figure 6A:
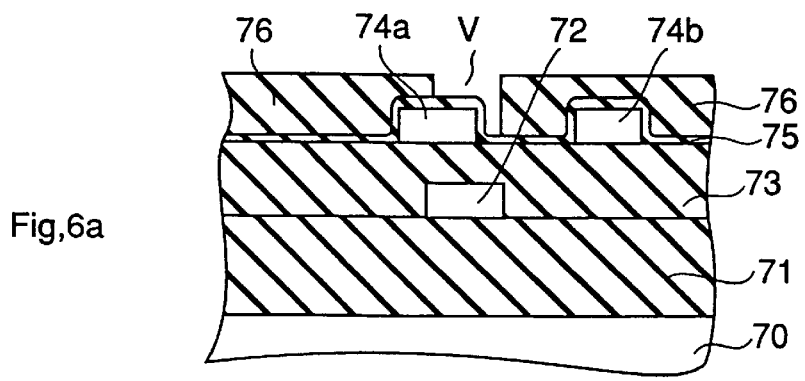
FIGS. 6a–6c illustrate in cross-section some of the major steps in the manufacture of a MOS transistor in accordance with a second embodiment of the invention, for explanation of a method of connecting between wiring layers in different layers.
Figure 6B:
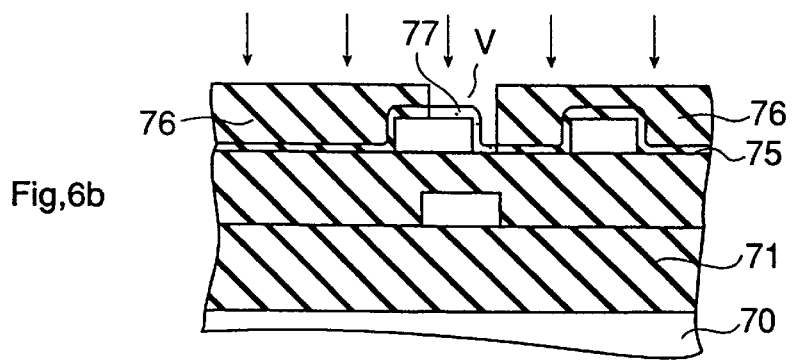
Figure 6C:
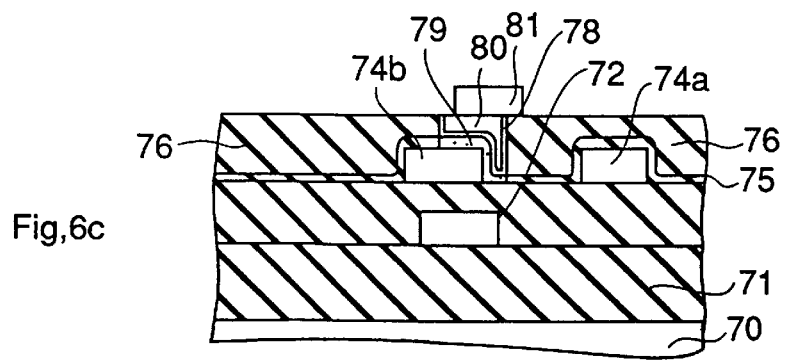

First, as shown in FIG. 6a, prepare a semiconductor substrate 70 made of silicon with a semiconductor device component (not shown) such as a MOS transistor being formed on its main surface. Form on the main surface of semiconductor substrate 70 a first interlayer insulator 71, a first-layer wiring layer 72 on this interlayer insulator 71, a second interlayer insulator 73 covering the first-layer wiring layer 72, and second-layer wiring layers 74a, 74b on the second interlayer insulator 73. Each wiring layer is fabricated by forming a metal film by sputtering or CVD techniques on the surface of substrate 70 and then patterning the metal film through photolithography and anisotropic etching treatment into a predefined wiring layer pattern. Each interlayer insulator is formed by LPCVD techniques to a predetermined thickness. And, as shown in FIG. 6a, form a silicon nitride film 75 covering the second-layer wiring layers 74a, 74b. The thickness of film 75 is determined in a way as described in the first embodiment. Next, form a low-dielectric-constant insulative film as a third interlayer insulator 76, which may be a fluorine doped silicon oxide film or equivalents thereof. And, as shown in FIG. 6a, effectuate photolithography and anisotropic etching to form in the low-dielectric-constant insulative film a "via" contact hole V for connection by via-contact to the second wiring layer 74a. This etching is done in a way such that a gas or gasses are carefully chosen to enable achievement of the intended selection ratio of silicon oxide constituting the interlayer insulator 76 with respect to the silicon nitride film 75 while appropriately adjusting plasma's gas pressure and substrate temperature and others.

Thereafter, the semiconductor substrate 70 is doped with a chosen impurity such as Ar or the like by ion implantation with similar settings of acceleration energy and dose amount to those in the first embodiment stated supra. In this way, residual Si—N bonds in selected part of the silicon nitride film 75 as exposed at the bottom of the contact hole V are cut off providing a Si/N mixture layer 77 as shown in FIG. 6b.

Subsequently, a Ti film 78 is formed on the main surface of substrate 70 and then thermally processed in a way similar to that in the first embodiment, to thereby convert only part of the mixture layer 77 at the bottom of contact hole V into a TiN layer 79 that selectively contains Si therein.

Thereafter, a metal wiring layer 81 is formed on the main surface of substrate 70 in a way similar to that in the first embodiment mentioned previously, thereby completing the semiconductor device manufacturing method in accordance with the second embodiment of the invention.

Figure 7A:
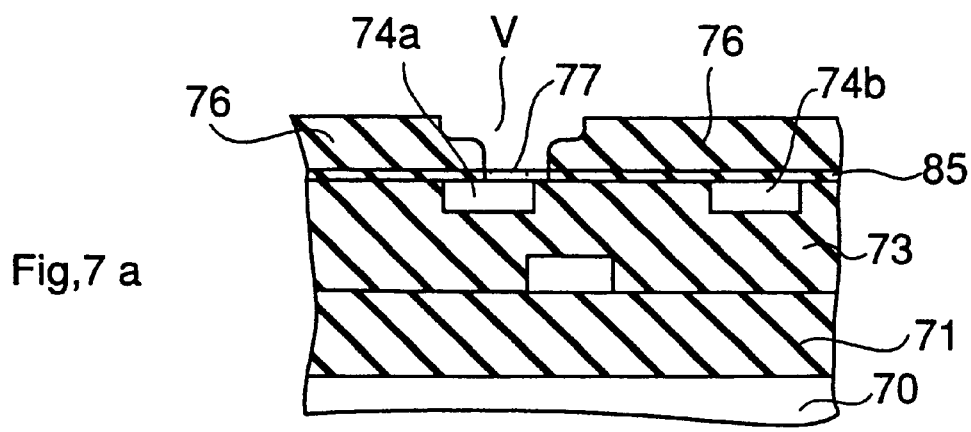
FIGS. 7a–7b show in cross-section some of the major steps in the manufacture of a MOS transistor in accordance with a first applied example of the second embodiment, for explanation of a method of connecting between wiring layers in different layers.
Figure 7B:
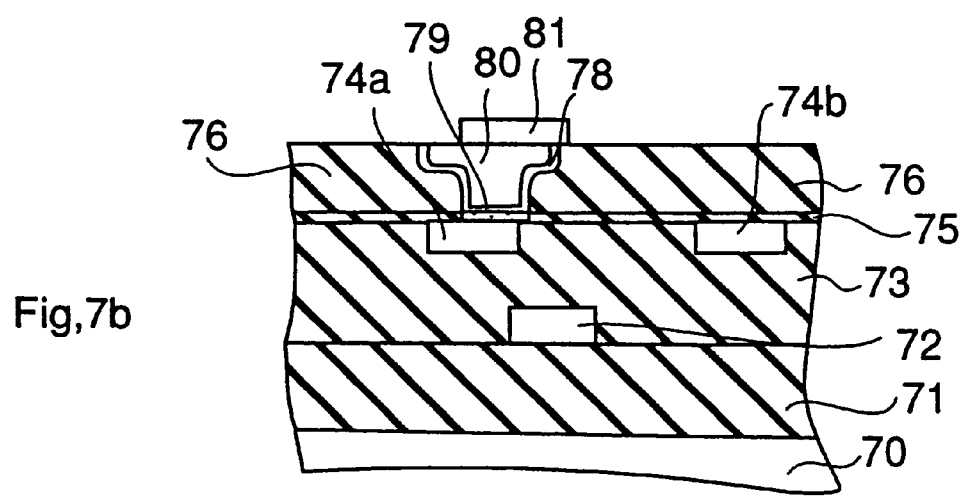

An explanation will next be given of a first applied example of the second embodiment with reference to FIGS. 7a and 7b. This example depicted is the one which applies the principles of the invention to a chip wiring layer structure having a wiring layer as buried in the surface of an interlayer insulator.

First, form a first interlayer insulator 71, first-layer wiring layer 72, and second interlayer insulator 73 in a way similar to that described in conjunction with the second embodiment. And, apply photo-lithography process and anisotropic etching to resultant structure for selective removal of a specified region on the surface of the second interlayer insulator 73 in which region a second-layer wiring layer will be formed; then, form therein more than one groove (trench), typically 0.5 nm wide. Then, as shown in FIG. 7a, form buried second-layer metal wiring layers 74a, 74b of Al or the like in resultant trenches. The formation of such buried metals may be done by forming a chosen wiring layer material of the second-layer wiring layers 74a, 74b on the main surface of substrate 70 to a thickness of about 1 μm, and then backetching the resulting surface by CMP or RIE techniques. Forming such buried metals as the second-layer wiring layers 74a, 74b makes it possible to planarize the second-layer interlayer insulator 73 to have a uniform or flat surface as a whole. Optionally, an adhesion enhancer film (a TiN layer, for example) may be provided between the wiring layer material and interlayer insulator. After the planazation, a silicon nitride film 85 is formed on the resulting flat surface as shown in FIG. 7a in a way similar to that in the first embodiment discussed previously. Further, a low-dielectric-ratio insulative film which will become a third interlayer insulator 76 is formed on the silicon nitride film 85; then, certain part of this insulative film of typically 0.5 μm thick in a selected region in which the third interlayer insulator will be formed is removed using photo-lithography and anisotropic etching techniques under the same condition as that described in the first embodiment. Further, specific part used for formation of a "via" contact hole is limitatively defined by photolithography process. After effectuation of RIE process, the substrate 70 is doped by ion-implantation with a chosen impurity such as Ar or the like in a way similar to that in the first embodiment, thereby cutting off residual Si—N bonds in the silicon nitride film Next, as shown in FIG. 7a, a selected portion of the silicon nitride film 85 as exposed at the bottom of the via contact hole V is converted to a mixture layer 77 comprised of a mixture of Si and N.

Then, as in the first embodiment, a Ti film 78 is formed on the main surface of substrate 70 by sputtering or CVD techniques. The resulting substrate 70 is then subject to thermal processing in a way similar to that in the first embodiment thereby forming a TiN layer 79 that contains Si. Subsequently, as shown in FIG. 7b, a third-layer wiring layer of Al or the like is formed on the main surface of substrate 70, which layer is then planarized through polishing process such as chemical mechanical polishing or the like to provide a flat surface thereon thus completing the semiconductor device structure in accordance with the first applied example.

Figure 8:
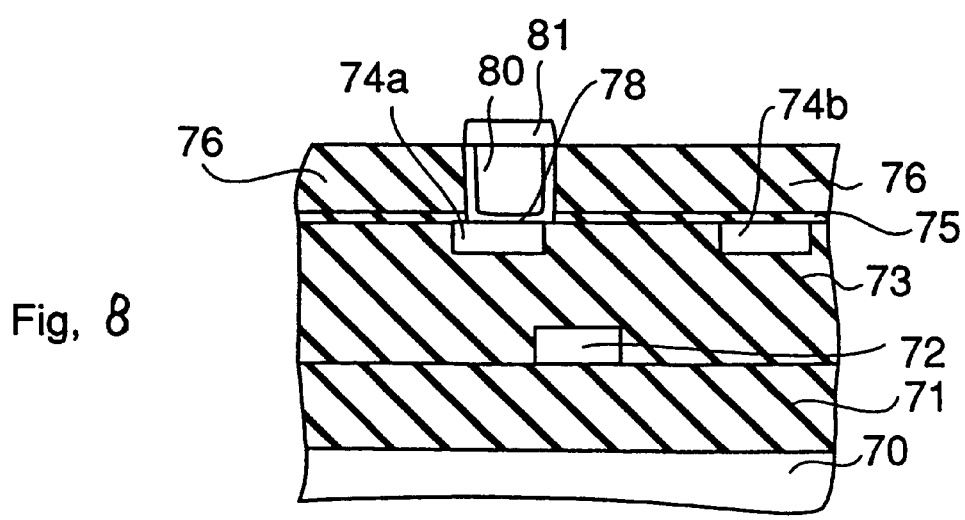
FIG. 8 is a sectional view of a MOS transistor in accordance with a second applied example of the second embodiment, for explanation of a method of connecting between wiring layers in different layers.
Figure 9:
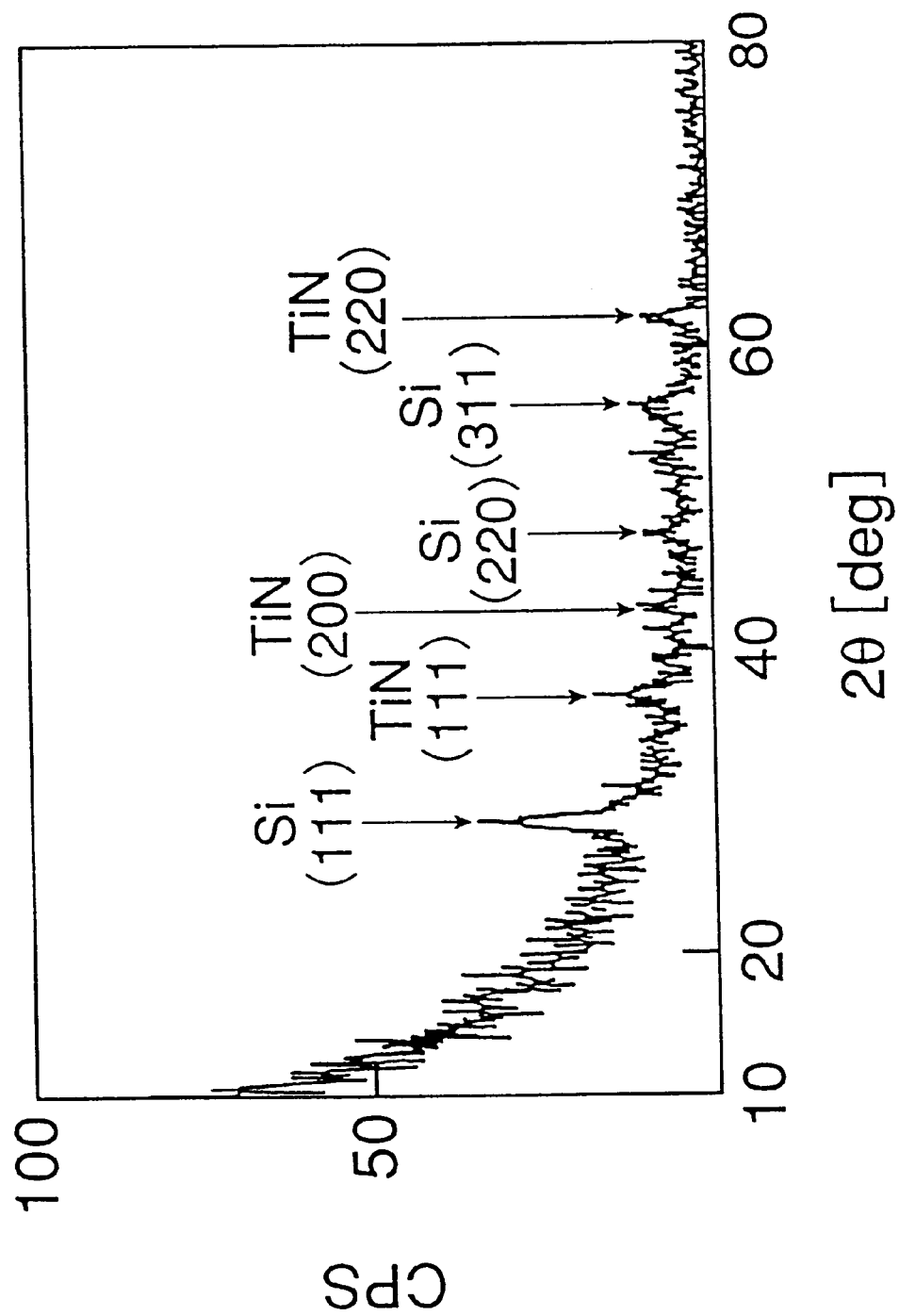
FIG. 9 is a show XRD(X-Ray Diffraction) patten obtained for a film consisted of Ti, Si N after annealing. It shows TiN bonding (not SiN bonding) in the film.

A second applied example of the second embodiment will next be explained with reference to FIG. 8.

In the second example shown, after formation of the second-layer wiring layers 74a, 74b buried in the interlayer insulator 73 in the same way as that in the first example, a silicon nitride film 75 is formed on the resultant surface thereof. Subsequently, a third interlayer insulator 76 is formed in the surface of the silicon nitride film 75; then, a surface portion of such silicon nitride film 75 in a selected region in which the third-layer wiring layer will be formed is removed away to the extent that the surface of its underlying silicon nitride film 75 is exposed to the outside to thereby form more than one contact hole. With the interlayer insulator 76 being as a mask, the Si/N-mixture layer is partly removed by etching treatment under a carefully determined condition that allows achievement of the intended etching selection ratio with respect to a constituent material of the interlayer insulator 76, e.g. silicon oxide, and a conductive material constituting the second-layer wiring layer 74a. When this is done, the etching selection ratio may be rendered higher by applying the ion implantation to the surface of semiconductor substrate 70 for cutting Si—N bonds residing in the silicon nitride film, as has been described the applied example of the first embodiment.

Thereafter, a conductive film is formed as a third-layer wiring layer 81; then, this conductive film is patterned to have a predefined pattern corresponding to the planar shape of the third-layer wiring layer 81 thereby completing the procedure of the semiconductor device manufacturing method of the second example.

It must be noted here that while the aforesaid manufacturing methods of the first and second applied examples are specifically drawn to formation of the second- and third-layer wiring layers by way of example, the principles of the present invention may alternatively be applicable, without any conceptual alterations, to a lamination of layers at any levels over the substrate, including an n-th ("n" is an integer) layer and (n+1)th layer.

It is also noted that while in the prescribed embodiments the interlayer insulator is structured from the silicon nitride film 57 as formed on the main surface of the semiconductor substrate 50 to thereby improve the etching selection ratio with respect to silicon oxide film constituting the interlayer insulator, the present invention should not exclusively be limited thereto. The invention may offer similar advantages when the interlayer insulator is a BN film or any equivalents thereto, by way of example.

It is further noted that the conductive wiring layer material should not be limited to Al only, and may alternatively be low-resistivity metals such as Cu or Ag, high-melting-point metallic materials such as W or Mo or the like, any possible compounds of such materials and semiconductor, or polysilicon or equivalents thereof.

It is further noted that the semiconductor substrate as used in the illustrative embodiments may be replaced with a specific substrate having a lamination structure with an insulative film sandwiched between a semiconductor substrate and an overlying semiconductor layer, the principles of the invention being applicable to fabrication of IC components as formed in the semiconductor layer. It would be appreciated by those skilled in the art that such substrate structure may be fabricated by SIMOX techniques including the steps of doping an impurity by ion implantation into the silicon substrate, and applying thereto thermal processing to thereby form an silicon oxide layer that is in the substrate surface at a specified depth. Yet further, the invention is implementable in device structures employing a silicon-on-insulator (SOI) substrate obtainable by selectively forming an insulative film on a semiconductor substrate with its surface partly exposed, and forming by epitaxial growth a semiconductive layer as grown from a partial region in which the substrate surface is exposed.

What is claimed is:

1. A method of manufacturing a semiconductor device, comprising:
    forming a gate electrode adjacent to a main surface of a semiconductor substrate;
    forming a source and a drain electrode in the main surface of the semiconductor substrate, the gate electrode disposed between the source electrode and the drain electrode;
    forming a first nitride layer over one of the gate electrode, the source electrode, and the drain electrode, the first nitride layer comprising insulator nitride, the insulator nitride being compound of nitrogen and a material;
    forming an interlayer insulator over the first nitride layer, and the interlayer insulator has a through-hole above one of the gate electrode, the source electrode, and the drain electrode;
    forming a second nitride layer comprising a conductive nitride, the second nitride layer being at a bottom of the through-hole; and
    forming a wiring layer in the through-hole, the wiring layer coupled to one of the gate electrode, the source electrode, and the drain electrode, through the second nitride layer,
    wherein bonding energy of the conductive nitride is higher than that of the insulator nitride.

2. A method of manufacturing a semiconductor device, comprising:
    forming a gate electrode adjacent to a main surface of a semiconductor substrate;
    forming a source and a drain electrode in the main surface of the semiconductor substrate, the gate electrode disposed between the source electrode and the drain electrode;
    forming a first nitride layer over one of the gate electrode, the source electrode, and the drain electrode, the first nitride layer comprising insulator nitride, the insulator nitride being compound of nitrogen and a material;
    forming an interlayer insulator over the first nitride layer, and the interlayer insulator has a through-hole above one of the gate electrode, the source electrode, and the drain electrode,
    forming a second nitride layer comprising a conductive nitride, the second nitride layer being at a bottom of the through-hole; and
    forming a wiring layer in the through-hole, the wiring layer coupled to one of the gate electrode, the source electrode, and the drain electrode, through the second nitride layer,
    wherein forming the second nitride layer comprises forming a conductive layer comprising a metal on the first nitride layer at the bottom of the through-hole after cutting bond between the nitrogen and the material of the insulator nitride, and bonding the cut nitrogen and the metal to form the conductive nitride.

3. A method of manufacturing a semiconductor device as set forth in claim 2, wherein cutting bond between the nitrogen and the material comprises ion implantation process selectively into the first nitride layer at the bottom of the through-hole, the ion implantation process using the interlayer insulator layer as a mask layer.

4. A method of manufacturing a semiconductor device as set forth in claim 2, wherein the insulator nitride is SiN, and the conductive nitride is a material selected from the group consisting AIN, NiN, CoN, HfN, CuN, TaN, ZrN, NbN, VN, WSiN, TiN, and TaSiN.

5. A method of manufacturing a semiconductor device as set forth in claim 2, wherein the insulator nitride is BN, and the conductive nitride is material selected from the group consisting AIN, NiN, CoN, HfN, CuN, TaN, ZrN, NbN, VN, WSiN, and TaSiN.

6. A method of manufacturing a semiconductor device as set forth in claim 2, wherein forming the conductive layer comprising the metal is sequentially continued without interposed annealing process after cutting bond between the nitrogen and the material.

7. A method of manufacturing a semiconductor device as set forth in claim 2, wherein bonding energy of the conductive nitride is higher than that of the insulator nitride.

8. A method of manufacturing the semiconductor device as set forth in claim 2, wherein etching rate of the interlayer insulator layer and the first nitride layer are different from each other, and further comprising forming the through-hole by selectively etching part of the insulator nitride layer to expose top surface of the insulator nitride layer.

9. A method of manufacturing a semiconductor device, comprising:
    forming a gate electrode adjacent to a main surface of a semiconductor substrate;
    forming a source and a drain electrode in the main surface of the semiconductor substrate, the gate electrode disposed between the source electrode and the drain electrode;
    forming a first nitride layer over one of the gate electrode, the source electrode, and the drain electrode, the first nitride layer comprising insulator nitride, the insulator nitride being compound of nitrogen and a material;
    forming an interlayer insulator over the first nitride layer, and the interlayer insulator has a through-hole above one of the gate electrode, the source electrode, and the drain electrode;
    forming a second nitride layer comprising a conductive nitride, the second nitride layer being at a bottom of the through-hole;
    forming a wiring layer in the through-hole, the wiring layer coupled to one of the gate electrode, the source electrode, and the drain electrode, through the second nitride layer; and
    forming the through-hole by selectively etching part of the insulator nitride layer to expose top surface of the insulator nitride layer,
    wherein etching rate of the interlayer insulator layer and the first nitride layer are different from each other.

10. A method of manufacturing a semiconductor device, comprising:
- forming a first wiring layer or an electrode adjacent to a first insulator layer;
- forming a first nitride layer comprising a insulator nitride over the first wiring layer or the electrode, and the first insulator layer, the insulator nitride is compound of nitrogen and a material;
- forming a second nitride layer comprising conductive nitride, the second nitride layer being on the first wiring layer or the electrode, and the first insulator layer; and
- forming a second wiring layer on the second nitride layer, the second wiring layer being coupled to the first wiring layer or the electrode through the second nitride layer,
- wherein bonding energy of the conductive nitride is higher than that of the insulator nitride.

11. A method of manufacturing a semiconductor device, comprising:
- forming a first wiring layer or an electrode adjacent to a first insulator layer;
- forming a first nitride layer comprising a insulator nitride over the first wiring layer or the electrode, and the first insulator layer, the insulator nitride is compound of nitrogen and a material;
- forming a second nitride layer comprising conductive nitride, the second nitride layer being on the first wiring layer or the electrode, and the first insulator layer; and
- forming a second wiring layer on the second nitride layer, the second wiring layer being coupled to the first wiring layer or the electrode through the second nitride layer,
- wherein forming the second nitride layer comprises forming a conductive layer comprising a metal on the first nitride layer cutting bond between the nitrogen and the material of the insulator nitride, and bonding the cut nitrogen and the metal to form the conductive nitride.

12. A method of manufacturing a semiconductor device as set forth in claim 11, wherein the insulator nitride is SiN, and the conductive nitride is a material selected from the group consisting AlN, NiN, CoN, HfN, CuN, TaN, ZrN, NbN, VN, WSiN, TiN, and TaSiN.

13. A method of manufacturing a semiconductor device as set forth in claim 11, wherein the insulator nitride is BN, and the conductive nitride is material selected from the group consisting AlN, NiN, CoN, HfN, CuN, TaN, ZrN, NbN, VN, WSiN, and TaSiN.

14. A method of manufacturing a semiconductor device as set forth in claim 11, wherein cutting bond between the nitrogen and the material comprises ion implantation process selectively into the first nitride layer, the ion implantation process followed forming the conductive layer comprising the metal without interposed annealing process.

15. A method of manufacturing a semiconductor device as set forth in claim 11, wherein cutting bond between the nitrogen and the material is followed by forming the conductive layer comprising the metal without interposed annealing process.

16. A method of manufacturing a semiconductor device as set forth in claim 11, wherein bonding energy of the conductive nitride is higher than that of the insulator nitride.

17. A method of manufacturing the semiconductor device as set forth in claim 11, wherein etching rate of the interlayer insulator layer and the first nitride layer are different from each other, and further comprising forming the through-hole by selectively etching part of the insulator nitride layer to expose top surface of the insulator nitride layer.

18. A method of manufacturing a semiconductor device, comprising:
- forming a first wiring layer or an electrode adjacent to a first insulator layer;
- forming a first nitride layer comprising a insulator nitride over the first wiring layer or the electrode, and the first insulator layer, the insulator nitride is compound of nitrogen and a material;
- forming a second nitride layer comprising conductive nitride, the second nitride layer being on the first wiring layer or the electrode, and the first insulator layer; and
- forming a second wiring layer on the second nitride layer, the second wiring layer being coupled to the first wiring layer or the electrode through the second nitride layer,
- wherein etching rate of the interlayer insulator layer and the first nitride layer are different from each other, and further comprising forming the through-hole by selectively etching part of the insulator nitride layer to expose top surface of the insulator nitride layer.

19. A method of manufacturing a semiconductor device, comprising:
- forming a gate electrode adjacent to a main surface of a semiconductor substrate;
- forming a source and a drain electrode in the main surface of the semiconductor substrate, the gate electrode disposed between the source electrode and the drain electrode;
- forming a first nitride layer over one of the gate electrode, the source electrode, and the drain electrode, the first nitride layer comprising insulator nitride, the insulator nitride being compound of nitrogen and a material;
- forming an interlayer insulator over the first nitride layer, and the interlayer insulator has a through-hole above one of the gate electrode, the source electrode, and the drain electrode;
- forming a conductive layer comprising a metal on the first nitride layer at the bottom of the through-hole after ion implantation process selectively into the first nitride layer at the bottom of the through-hole, the ion implantation process using the interlayer insulator layer as a mask layer;
- forming a second nitride layer comprising a conductive nitride being compound of nitrogen and the metal; and
- forming a wiring layer in the through-hole, the wiring layer coupled to one of the gate electrode, the source electrode, and the drain electrode, through the second nitride layer.

20. A method of manufacturing a semiconductor device, comprising:
- forming a first wiring layer or an electrode adjacent to a first insulator layer;
- forming a first nitride layer comprising a insulator nitride over the first wiring layer or the electrode, and the first insulator layer, the insulator nitride is compound of nitrogen and a material;
- forming a conductive layer comprising a metal on the first nitride layer after ion implantation process selectively into the first nitride layer at the bottom of the through-hole, the ion implantation process followed forming the conductive layer comprising the metal without interposed annealing process;
- forming a second nitride layer comprising conductive nitride being compound of nitrogen and the metal; and
- forming a second wiring layer on the second nitride layer, the second wiring layer being coupled to the first wiring layer or the electrode through the second nitride layer.

* * * * *